United States Patent
Uozumi et al.

(10) Patent No.: US 7,499,688 B2
(45) Date of Patent: *Mar. 3, 2009

(54) COMMUNICATION SEMICONDUCTOR INTEGRATED CIRCUIT DEVICE AND A WIRELESS COMMUNICATION SYSTEM

(75) Inventors: Toshiya Uozumi, Takasaki (JP); Yasuyuki Kimura, Maebashi (JP); Hirotaka Osawa, Isesaki (JP); Satoru Yamamoto, Takasaki (JP); Robert Astel Henshaw, Royston (GB)

(73) Assignees: Renesas Technology Corp., Tokyo (JP); TTPOM Limited, Royston (GB)

( * ) Notice: Subject to any disclaimer, the term of this patent is extended or adjusted under 35 U.S.C. 154(b) by 18 days.

This patent is subject to a terminal disclaimer.

(21) Appl. No.: 11/727,216

(22) Filed: Mar. 26, 2007

(65) Prior Publication Data

US 2007/0164828 A1    Jul. 19, 2007

Related U.S. Application Data

(63) Continuation of application No. 11/181,876, filed on Jul. 15, 2005, now Pat. No. 7,205,850.

(30) Foreign Application Priority Data

Jul. 19, 2004    (GB)    ................... 0416117.0

(51) Int. Cl.
    *H04B 7/00*    (2006.01)
(52) U.S. Cl. .................. 455/260; 455/76; 455/323; 455/127.4; 375/219; 331/23
(58) Field of Classification Search .............. 455/260, 455/76, 323, 127.4; 375/219; 331/23
See application file for complete search history.

(56) References Cited

U.S. PATENT DOCUMENTS

| | | | |
|---|---|---|---|
| 2002/0042256 | A1 | 4/2002 | Baldwin et al. |
| 2003/0224743 | A1 | 12/2003 | Okada et al. |
| 2004/0183610 | A1 | 9/2004 | Seppinen et al. |
| 2004/0248528 | A1 | 12/2004 | Rozenblit et al. |
| 2005/0064828 | A1 | 3/2005 | Kurakami et al. |
| 2005/0119025 | A1 | 6/2005 | Mohindra et al. |

FOREIGN PATENT DOCUMENTS

| | | |
|---|---|---|
| GB | 2 393 050 A | 3/2004 |
| JP | 2003-158452 | 5/2003 |
| JP | 2004-112749 | 4/2004 |

*Primary Examiner*—Joseph Chang
(74) *Attorney, Agent, or Firm*—Mattingly, Stanger, Malur & Brundidge, P.C.

(57) ABSTRACT

In a communication semiconductor integrated circuit device using offset PLL architectures and including an oscillator circuit and a frequency divider circuit generating an intermediate frequency signal, the oscillator circuit includes an oscillator, a programmable frequency divider which frequency-divides the oscillation signal in accordance with frequency division information, a phase comparator detecting a phase difference between an output signal of the programmable frequency divider and a reference signal, and a frequency control unit for outputting a signal indicative of the phase difference and controlling the oscillation frequency of the oscillator, wherein a frequency division ratio generator circuit generates an integer part I and a fraction part F/G based on band information concerning the use frequency band and mode information along with channel information and for producing the frequency division ratio information to thereby give it to the programmable frequency divider.

12 Claims, 8 Drawing Sheets

| TRANSMIT/ RECEIVE T/R | BAND (BND) | IF DIVIDING RATIO (NIF) | DEC1 OUTPUT X |
|---|---|---|---|
| TRANSMIT | GSM850 GSM900 | 40 | 20 |
| | | 44 | 22 |
| | | 48 | 24 |
| | | 52 | 26 |
| | DCS1800 PCS1900 | 40 | 20 |
| | | 44 | 22 |
| | | 48 | 24 |
| | | 52 | 26 |
| RECEIVE | GSM850 GSM900 | 40 | 18 |
| | | 44 | 20 |
| | | 48 | 22 |
| | | 52 | 24 |
| | DCS1800 PCS1900 | 40 | 19 |
| | | 44 | 21 |
| | | 48 | 23 |
| | | 52 | 25 |

INPUT: TRANSMIT/RECEIVE T/R, BAND (BND), IF DIVIDING RATIO (NIF)

FIG. 5

| BAND (BND) | IF DIVIDING RATIO (NIF) | DEC2 OUTPUT Y | 65Y |
|---|---|---|---|
| GSM850 GSM900 | 40 | 18 | 1170 |
| | 44 | 20 | 1300 |
| | 48 | 22 | 1430 |
| | 52 | 24 | 1560 |
| DCS1800 PCS1900 | 40 | 19 | 1235 |
| | 44 | 21 | 1365 |
| | 48 | 23 | 1495 |
| | 52 | 25 | 1625 |

(INPUT: BAND, IF DIVIDING RATIO)

COMMUNICATION SEMICONDUCTOR INTEGRATED CIRCUIT DEVICE AND A WIRELESS COMMUNICATION SYSTEM

This application is a continuation application of U.S. application Ser. No. 11/181,876, filed Jul. 15, 2005, now U.S. Pat. No. 7,205,850, the entirety of which is incorporated herein by reference.

INCORPORATION BY REFERENCE

The present application claims priority from U.K. application 0416117.0 filed on Jul. 19, 2004, the content of which is hereby incorporated by reference into this application.

BACKGROUND OF THE INVENTION

The present invention relates to techniques for effective use in semiconductor integrated circuit devices having an on-chip voltage controlled oscillator (VCO) and a phase-locked loop (PLL) circuit which includes the VCO within its loop. More particularly but not exclusively, the invention relates to techniques for effective use in semiconductor integrated circuit devices for the communication use employing offset PLL architectures and having a built-in signal transmission VCO for up-converting the frequency of a transmission signal and a built-in PLL circuit including the VCO within its loop in a wireless communication system such as for example portable or "mobile" telephone, and also relates to wireless communication systems.

In wireless communication systems such as mobile or cellular phones, semiconductor integrated circuit devices for the communication use (referred to as high-frequency ICs hereinafter) are used which synthesize a local oscillation signal of high frequency to a receiving signal and/or a sending signal to thereby perform down-conversion and up-conversion, and which perform modulation of the send signal along with demodulation of the receive signal. In such high-frequency ICs, there is the so-called offset PLL architecture for applying quadrature modulation to transmission I, Q signals using a carrier wave of intermediate frequency, and also for mixing together a feedback signal from the output side of a signal transmission VCO and a high-frequency oscillation signal from RFVCO to thereby effectuate down conversion into an intermediate frequency signal equivalent to a frequency difference (offset), and thereafter performing phase comparison of this signal with a signal obtained after the above-noted quadrature modulation to thereby control the transmission VCO in accordance with a phase difference thus detected.

SUMMARY OF THE INVENTION

For the high-frequency ICs of such the offset PLL scheme, an IFVCO which generates the intermediate frequency carrier wave is required in addition to the transmission VCO and the RFVCO. As the VCO requires a relatively large chip occupation area, a high-frequency IC which is disclosed for example in JP-A-2003-158452 is designed to use an externally provided VCO. However, the use of such external VCO would result in an increase in number of parts, and makes miniaturization or downsizing of IC chips difficult. In view of this, it has been proposed to design the VCO in an on-chip fashion. Unfortunately, letting all of the above-noted three VCOs be integrated together on the same chip results in an increase in chip size, which leads to an increase in chip cost. Additionally, one of those inventions as to the offset PLL scheme-based high-frequency IC is disclosed for example in JP-A-2004-112749.

In order to lessen the chip size of the high-frequency IC with built-in VCOs, the inventors of the present invention herein have studied and considered about an approach to reducing the number of VCOs by commonization of RFVCO and IFVCO—more specifically, deleting IFVCO by frequency division of an oscillation signal of RFVCO to generate a local signal of intermediate frequency. As a result, it is possible to set up an appropriate frequency division ratio by a relatively simple logic circuit if a programmable frequency divider (counter) within the PLL loop including VCO is the one that sets a frequency division ratio of an integer; however, in the case of setup of such frequency division ratio of the integer, it is possible to switch the oscillation frequency only at a frequency interval which is the same as the frequency of a reference signal. On the other hand, in the case of commonization of RFVCO and IFVCO, more precise or "finer" change of the oscillation frequency becomes necessary. Thus it has been found that it must operate the programmable frequency divider at a frequency division ratio including a decimal number.

Unfortunately, when an attempt is made to build in the high-frequency IC a logic circuit for setting up the frequency division ratio including the decimal, the logic circuit becomes larger in scale, and it becomes difficult to reduce the chip size. Additionally, although there is considered another scheme for providing a memory within the high-frequency IC to pre-store in this memory all possible frequency division ratios corresponding to use frequencies, the significance in number of the frequency division ratios requires the memory to increase in storage capacity, which leads to an increase in chip size. In addition, there may also be considered a method for giving the frequency division ratios including decimal numbers from outside of the chip (base band circuit). However, this approach is faced with a problem which follows: an external device such as the baseband circuit for determination of the transmission frequency increases in functions required, resulting in a remarkable increase in workload of designers who attempt to develop and establish a communications system using high-frequency ICs.

It is therefore an object of the present invention to reduce the chip size of a communication semiconductor integrated circuit device (high-frequency IC) which frequency-divides an oscillation signal of reference oscillation circuitry RFVCO used for frequency conversion to thereby generate an intermediate frequency carrier wave (local signal), modulates sending I, Q signals by the intermediate frequency carrier, and performs upward conversion into a desired send frequency at a transmission VCO, and then performs transmission thereof.

Another object of this invention is to lessen the workload of system designers who are responsible for designing a system which uses the communication semiconductor integrated circuit device (high-frequency IC) which frequency-divides an oscillation signal of reference oscillation circuitry RFVCO used for frequency conversion to thereby generate an intermediate frequency carrier wave (local signal), modulates the sending I, Q signals by the intermediate frequency carrier, and performs up conversion to a desired transmission frequency at a transmission VCO, and then performs transmission thereof.

Still another object of the invention is to simplify logic circuitry for setup of the frequency division ratio containing a decimal with respect to a programmable frequency divider within a PLL loop including RFVCO to thereby reduce the chip size, in the communication semiconductor integrated circuit device (high-frequency IC) which does not have IFVCO and which frequency-divides an oscillation signal of RFVCO used for frequency conversion to thereby generate an intermediate frequency carrier wave (local signal), modulates sending I, Q signals by the intermediate frequency carrier, and performs up conversion to a desired transmission frequency at a transmission VCO, and then performs transmission thereof.

A further object of the invention is to reduce the functions required for external circuitry, that is, a control circuit which determines the transmission frequency, to thereby lighten the workload of system designers, in the communication-use semiconductor integrated circuit device (high-frequency IC) which does not have IFVCO and which frequency-divides an oscillation signal of RFVCO used for frequency conversion to thereby generate an intermediate frequency carrier wave, modulates sending I, Q signals by the intermediate frequency carrier, and performs up conversion to a desired transmission frequency at a transmission VCO, and then performs transmission thereof.

These and other objects and new features of the invention will be apparent from the following more particular description of preferred embodiments of the invention, as illustrated in the accompanying drawings.

A brief explanation of summary of some representative ones of the inventive concepts as disclosed herein is as follows.

In a semiconductor integrated circuit device (high-frequency IC) for the communication use which employs the offset scheme and which comprises an oscillation circuit for generating an oscillation signal with a frequency pursuant to an externally set value, and a frequency division circuit for frequency division of the oscillation signal as generated by the oscillation circuit to thereby generate a signal of intermediate frequency, the oscillation circuit is arranged to include an oscillator (RFVCO), a programmable frequency divider (counter) capable of frequency-dividing an oscillation signal of the oscillator in accordance with a frequency division ratio supplied thereto, a phase comparator for detection of a phase difference between an output signal of the programmable frequency divider and a reference signal, and a frequency control means for outputting a voltage or a current pursuant to the phase difference detected by the phase comparator and for controlling the oscillation frequency of the oscillator. There is also provided a frequency division ratio generation circuit for generating an integer part I and a fraction part F/G based on band information concerning an externally supplied use frequency band and mode information indicative of whether signal transmission or reception and also channel information as to a setup frequency and for generating a frequency division ratio based on the integer part I and fraction part F/G to thereby give the ratio to the programmable frequency divider. More desirably, the frequency division ratio to be given to the programmable frequency divider is generated while also referring to the setup information as to the frequency division ratio of the above-noted frequency divider circuit.

According to the invention stated above, it is no longer necessary to let the IFVCO be built in the chip since it generates the intermediate frequency carrier wave through frequency division of the oscillation signal of RFVCO. Thus it is possible to reduce the chip size. In addition, as it is possible to automatically generate the frequency division ratio of programmable frequency divider inside of the semiconductor chip and then give it to the programmable frequency divider, it is possible to lessen the information as generated at external apparatus such as the base band circuit. Thus it is possible to lighten the workload of users, that is, system designers.

Note here that one desirable arrangement is that the denominator G and numerator F of the fraction part F/G are arranged to be generated based on any integer as selected from a combination or combinations of a plurality of integers which are prepared in advance in a way corresponding to the band information and the frequency division ratio setup information of the frequency divider circuit. With such an arrangement, it is possible to lessen the scale of the frequency division ratio generation circuit for generation of the frequency division ratio of the programmable frequency divider including a decimal such as represented by an integer part I and fraction part F/G. This makes it possible to suppress increase in chip size.

Further desirably, there are provided at the input portion of the sigma-delta modulator a register in which decimal data of the numerator F of the fraction part F/G to be output from the frequency division ratio generation circuit can be set from the outside and an adder which adds together the decimal data being set at the register and the numerator F. Whereby, even where the frequency of a reference signal deviates due to variation or fluctuation of the power supply voltage between signal sending and receiving sessions, it is possible to correct such deviation.

A brief explanation of effects and advantages obtainable by the representative ones of the inventive concepts as disclosed herein is as follows.

In accordance with this invention, since the carrier wave of intermediate frequency is generated by frequency division of the oscillation signal of RFVCO, it is no longer required to let IFVCO be built in the chip while at the same time enabling simplification of logic circuitry for setup of the frequency division ratio with respect to the programmable frequency divider (counter) within the PLL loop including RFVCO. Thus it is possible to realize a communication semiconductor integrated circuit device (high-frequency IC) less in chip size.

It is also possible to achieve a communication semiconductor integrated circuit device (high-frequency IC) capable of lessening the functions required for external control circuitry, such as the base band IC for determination of the transmission frequency, to thereby enable alleviation of the workload of system designers.

Other objects, features and advantages of the invention will become apparent from the following description of the embodiments of the invention taken in conjunction with the accompanying drawings.

DESCRIPTION OF THE INVENTION

An explanation will next be given of embodiments of the present invention with reference to the accompanying drawings below.

Figure 1:
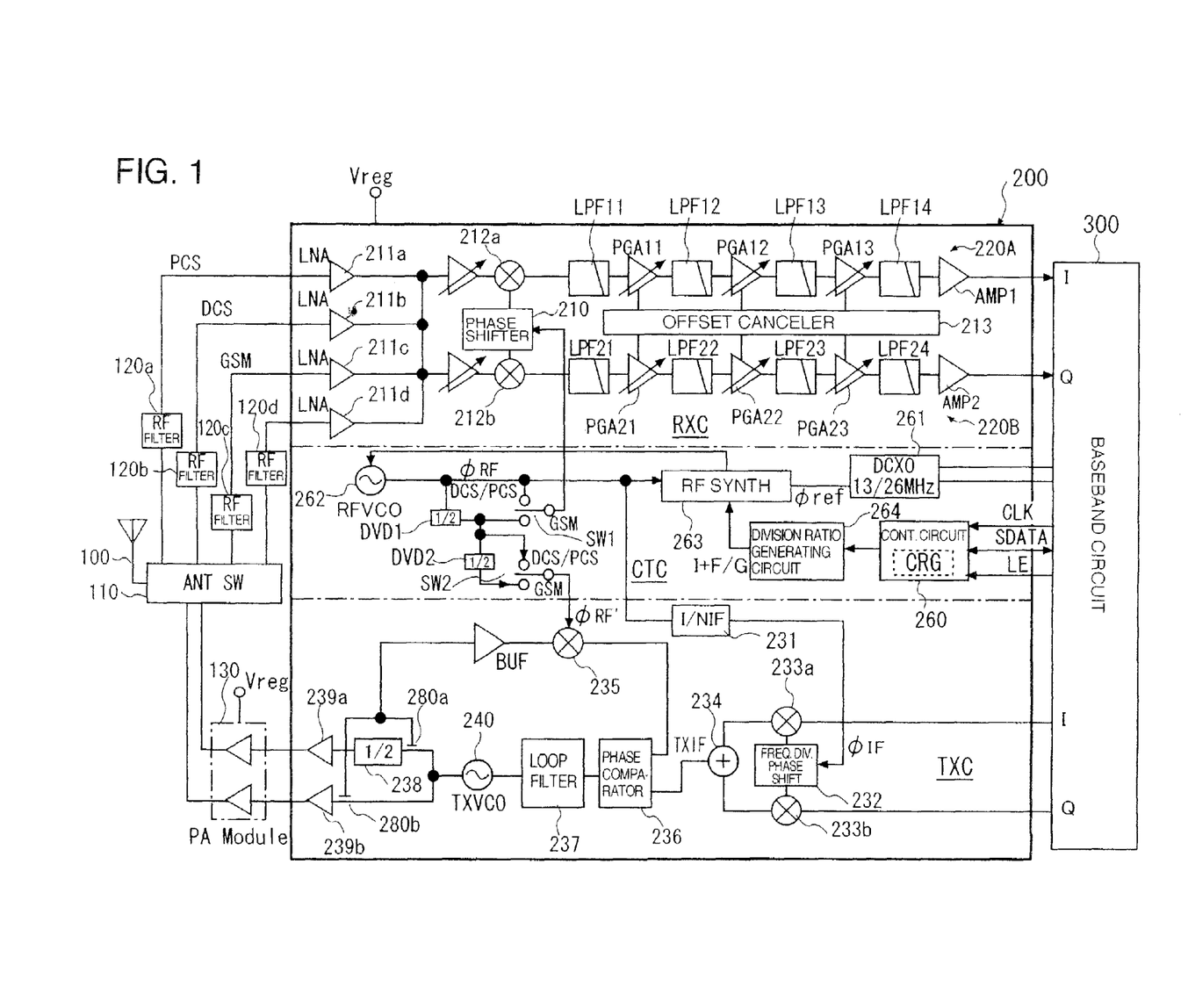
FIG. 1 is a block diagram showing one example of a communication semiconductor integrated circuit device (high-frequency IC) of multi-band scheme incorporating the principles of this invention along with a wireless communication system using the same.

FIG. 1 shows a semiconductor integrated circuit device (high-frequency IC) for the communication use employing multi-band schemes incorporating the principles of this invention along with one example of a wireless communication system using the same.

As shown in FIG. 1, the system is configured from several components including, but not limited to, an antenna 100 for transmission and reception of signal waves, a switch 110 used for signal transmit-and-receive changeover, high-frequency filters 120a to 120d each including a SAW filter for removing unnecessary waves from a received signal or the like, a high-frequency power amplifier circuit (power module) 130 for amplification of a sending signal, a high-frequency IC 200 which demodulates a received signal and modulates the send signal, and a base band circuit 300 which performs baseband processing tasks, such as conversion of an audio signal to be sent and/or a data signal into an "I" signal with the same phase component as a fundamental wave and a "Q" signal with an orthogonal component relative to the fundamental wave and conversion of the received I and Q signals thus demodulated into an audio signal or data signal, and which sends forth a signal for control of the high-frequency IC 200.

Each of the high-frequency IC 200 and the baseband circuit 300 is arranged as a semiconductor integrated circuit on a separate and individual semiconductor chip. Although not specifically limited, the system of the illustrative embodiment is such that the high-frequency IC 200 and high-frequency power amplifier circuit 130 are designed to operate by a power supply voltage Vreg to be supplied from the same voltage regulator.

Further, although not specifically limited, the high-frequency IC 200 of this embodiment is arranged to enable modulation and demodulation of signals having four different frequency bands by means of GSM850 and three communication schemes of GSM900, DCS1800 and PCS1900. In addition, in accordance with this arrangement, the high-frequency filters are arranged so that there are provided a filter 120a for permitting pass-through of a received signal having the frequency band of PCS1900, a filter 120b for permitting passage of a receive signal with the frequency band of DCS1800, and filters 120c, 120d for permitting passage of receive signals in the frequency band of GSM system.

The high-frequency IC 200 of this embodiment is generally constituted from a signal receiver circuit RXC, a signal transmitter circuit TXC, and a control circuit CTC which is made up of circuits in common to transmit-and-receive systems, such as other control circuits, clock generator circuitry and the like.

The signal receiver circuit RXC is generally configured from low noise amplifiers 211a, 211b, 211c, 211d for amplifying received signals in respective frequency bands of PCS, DCS and GSM, a frequency-division phase shifter circuit 210 which frequency-divides a local oscillation signal φRF that was generated at a high-frequency oscillation circuit (RFVCO) 262 as will be described later and then generates orthogonal signals with their phases being offset by 90 degrees to each other, mixers 212a, 212b which executes mixing of the orthogonal signals thus generated by the frequency-division phase shifter circuit 210 to the received signals that are amplified by the low noise amplifiers 211a, 211b, 211c, 211d to thereby perform demodulation and down-conversion operations, high-gain amplifier units 220A, 220B for amplifying the demodulated I and Q signals respectively for output to the baseband circuit 300, and an offset canceler circuit 213 for canceling of an input DC offset of the amplifiers within the high-gain amplifier unit 220A, 220B. The signal receiver circuit RXC of this embodiment employs the so-called direct conversion scheme for direct down-conversion of a received signal into a signal in the frequency band of the baseband.

The high-gain amplifier unit 220A is arranged so that a plurality of low pass filters LPF11, LPF12, LPF13, LPF14 and gain control amplifiers PGA1l, PGA12, PGA13 are alternately connected to have a serial connection form, with a gain-fixed amplifier AMP1 being connected at the final stage, for amplifying the demodulated I signal and then outputting it to the baseband circuit 300. Similarly the high-gain amplifier unit 220B is such that a plurality of low pass filters LPF21, LPF22, LPF23, LPF24 and gain control amps PGA21, PGA22, PGA23 are alternately connected into a series-connection form, with a gain-fixed amplifier AMP2 connected at the final stage, for amplifying the demodulated Q signal and outputting it to the baseband circuit 300.

The offset canceler circuit 213 is generally made up of analog-to-digital conversion (ADC) circuits which are provided in a way corresponding to respective gain control amplifiers PGA11-PGA23 for converting into a digital signal an output potential difference of them in the state that input terminals are electrically shorted together, digital-to-analog conversion (DAC) circuits which generate, based on conversion results of these AD converter circuits, input offset voltages for letting DC offsets of outputs of corresponding gain control amplifiers PGA11-23 be set at "0" and then give to a differential input, and a control circuit for controlling these AD converter (ADC) circuits and DA converter (DAC) circuits and for permitting execution of an offset canceling operation.

Provided in the controller circuit CTC are a control circuit (control logic) 260 for control of the entire chip, a reference oscillation circuit (DCXO) 261 for generating an oscillation signal φref for use as the reference, a high-frequency oscillation circuit (RFVCO) 262 which serves as a local oscillator circuit for generating a high-frequency oscillation signal φRF for the frequency conversion use, an RF synthesizer 263 which constitutes PLL circuitry together with the high-frequency oscillator circuit (RFVCO) 262, a frequency division ratio generating circuit 264 for generating and giving the frequency division ratio of a programmable frequency divider within the RF synthesizer 263, frequency divider circuits DVD1-DVD2 for frequency division of the oscillation signal φRF thus generated by the RFVCO 262, mode changeover switches SW1-SW2 and others.

The switch SW1, SW2 is such that its connection state is changed over between a GSM mode which performs signal transmit-and-receive operations in accordance with the GSM scheme and a DCS/PCS mode which performs signal send-and-receive operations in accordance with either the DCS or PCS scheme, thereby to select the frequency division ratio of a signal being transmitted. These switches SW1-SW2 are controlled by a signal from the control circuit 260.

There are supplied to the control circuit 260 a clock signal CLK for synchronization use coming from the baseband circuit 300, a data signal SDATA, and a load enable signal LEN for use as a control signal. When the load enable signal LEN is asserted to an effective level, the control circuit 260 sequentially captures data signals SDATA sent from the baseband circuit 300 in synchronization with the clock signal CLK and then generates control signals of chip inside in accordance with commands contained in the data signals SDATA. The data signals SDATA are sent in a serial fashion, although not specifically limited thereto.

Note here that since the reference oscillation signal φref is required to be high in frequency accuracy, an externally provided quartz oscillator is connected to the reference oscillator circuit 261. Typically the reference oscillation signal φref is designed to have a selected frequency of either 26 MHz or 13 MHz. The quartz oscillator with such frequency is one of general-purpose electronics components and is readily available in the marketplace. The RF synthesizer 263 is made up of a frequency divider circuit, phase comparator circuit, charge pump, loop filter and others.

The signal transmitter circuit TXC is generally made up of a frequency division circuit 231 which frequency-divides the oscillation signal φRF that is generated by the RFVCO 262 and generates an oscillation signal φIF of intermediate frequency such as for example 160 MHz, a frequency-division phase-shift circuit 232 which further frequency-divides the signal that was frequency-divided by the frequency divider circuit 231 and generates orthogonal or quadrature signals with their phases being shifted by 90 degrees from each other, modulator circuits 233a, 233b for modulation of the generated quadrature signals by the I and Q signals to be supplied from the baseband circuit 300, an adder 234 for synthesizing the signals thus modulated, a signal transmission oscillator circuit (TXVCO) 240 for generating a transmission signal φTX having a predetermined frequency, an offset mixer 235 for mixing together a feedback signal that is extracted by a coupler 280a, 280b or the like from the send signal φTX as output from the transmission oscillator circuit (TXVCO) 240 and a signal φRF' that is obtained by frequency division of a high-frequency oscillation signal φRF generated by the high-frequency oscillator circuit (RFVCO) 262 to thereby generate a signal with its frequency equivalent to a difference in frequency between these signals, a phase comparator 236 which compares an output of the offset mixer 235 with a signal TXIF synthesized by the adder 234 to thereby detect a phase difference, a loop filter 237 which generates a voltage pursuant to an output of the phase comparator 236, a frequency divider circuit 238 which frequency-divides an output of the transmission oscillator circuit (TXVCO) 240 for creation of a send signal of GSM, and buffer circuits 239a, 239b for transmission output use.

The transmitter circuit of this embodiment employs the offset PLL architecture and operates in such a way as to apply quadrature modulation to the sending I, Q signals by use of an intermediate frequency carrier wave and also perform the mixing of a feedback signal from the output side of TXVCO 240 and a signal φRF' that is obtained by frequency division of the high-frequency oscillation signal φRF of RFVCO 262 to thereby execute down-conversion to an intermediate frequency signal equivalent to a frequency difference (offset) and, thereafter, make phase comparison between this signal and the above-noted quadrature-modulated signal for control of TXVCO 240 in accordance with a phase difference. The phase detector 236, loop filter 237, TXVCO 240 and offset mixer 235 constitute a PLL circuit for transmission use (TX-PLL) which performs frequency conversion (up-convert). BFF is a buffer which amplifies the feedback signal extracted by the coupler 280a, 280b and then supplies it to the mixer 235.

In the multi-band wireless communication system of this embodiment, the control circuit 260 is responsive to a command from the baseband circuit 300 as an example for changing, in signal send-and-receive events, the frequency φRF of an oscillation signal of the high-frequency oscillation circuit 262 in accordance with an in-use band and channel while at the same time changing over the above-noted switch SW2 in accordance with whether GSM mode or DCS/PCS mode, whereby the oscillation signals being supplied to the signal receiver circuit RXC and signal transmitter circuit TXC are changed in frequency so that the switching of the send-and-receive frequency is performed. Furthermore, a control signal for changeover of the switch SW1, SW2 in response to the signal send-and-receive frequency band is supplied from the control circuit 260 to SW1, SW2. Additionally in this embodiment, the control signal from control circuit 260 is also used for setup of the frequency division ratio NIF of frequency divider circuit 231.

The oscillation frequency of RFVCO 262 is set at different values in a signal receiving mode and a sending mode. In the send mode, the oscillation frequency fRF of RFVCO 262 is set, for example, at 3616 to 3716 MHz in the case of GSM850, at 3840 to 3980 MHz in the case of GSM900, and at 3610 to 3730 MHz in the case of DCS, and further at 3860 to 3980 MHz in the case of PCS. This is frequency-divided to 1/4 at the frequency divider DVD1, DVD2 in the case of GSM or is frequency-divided to 1/2 in the cases of DCS and PCS, and then supplied as φRF' to the offset mixer 235 via the switch SW1, SW2.

At the offset mixer 235, a difference signal that is equivalent to a difference in frequency between this φRF' and the send-use oscillation signal φTX (i.e., fRF'−fTX) is output and then supplied to the phase comparator 236. The transmission PLL (TX-PLL) operates in such a way that the frequency of this difference signal becomes identical to the frequency of modulation signal TXIF. In other words, TXVCO 240 is controlled to oscillate at a frequency corresponding to the difference between the frequency (fRF/4 or fRF/2) of oscillation signal φRF' from RFVCO 262 and the frequency (fTX) of modulation signal TXIF.

In the receive mode, the oscillation frequency fRF of RFVCO 262 is set, for example, at 3476 to 3576 MHz in the case of GSM850, at 3700 to 3840 MHz in the case of GSM900, and at 3610 to 3730 MHz in the case of DCS, and further at 3860 to 3980 MHz in the case of PCS. In the case of GSM, this is frequency-divided to 1/2 by frequency divider DVD1; alternatively in the cases of DCS and PCS, it is supplied without frequency division to the frequency-division phase shifter circuit 210 whereby frequency division and phase shift are done to generate a quadrature signal(s) for supplement to the mixer 212a, 212b.

The RFVCO 262 is made up of an LC resonance type oscillator circuit and others and is arranged so that a parallel combination of a plurality of capacitive elements making up an LC resonator circuit are provided through respective switch elements. Such switch elements are caused to selectively turn on in response to a band changeover signal, thereby changing the value of a capacitive element to be connected, that is, the capacitance value of LC resonator circuit for enabling changeover of the oscillation frequency in a step-like manner. In addition, the RFVCO 262 is such that the capacitance value of a variable capacitive element is changed by a control voltage from the loop filter within RF synthesizer 263, permitting the oscillation frequency to change continuously.

Figure 2:
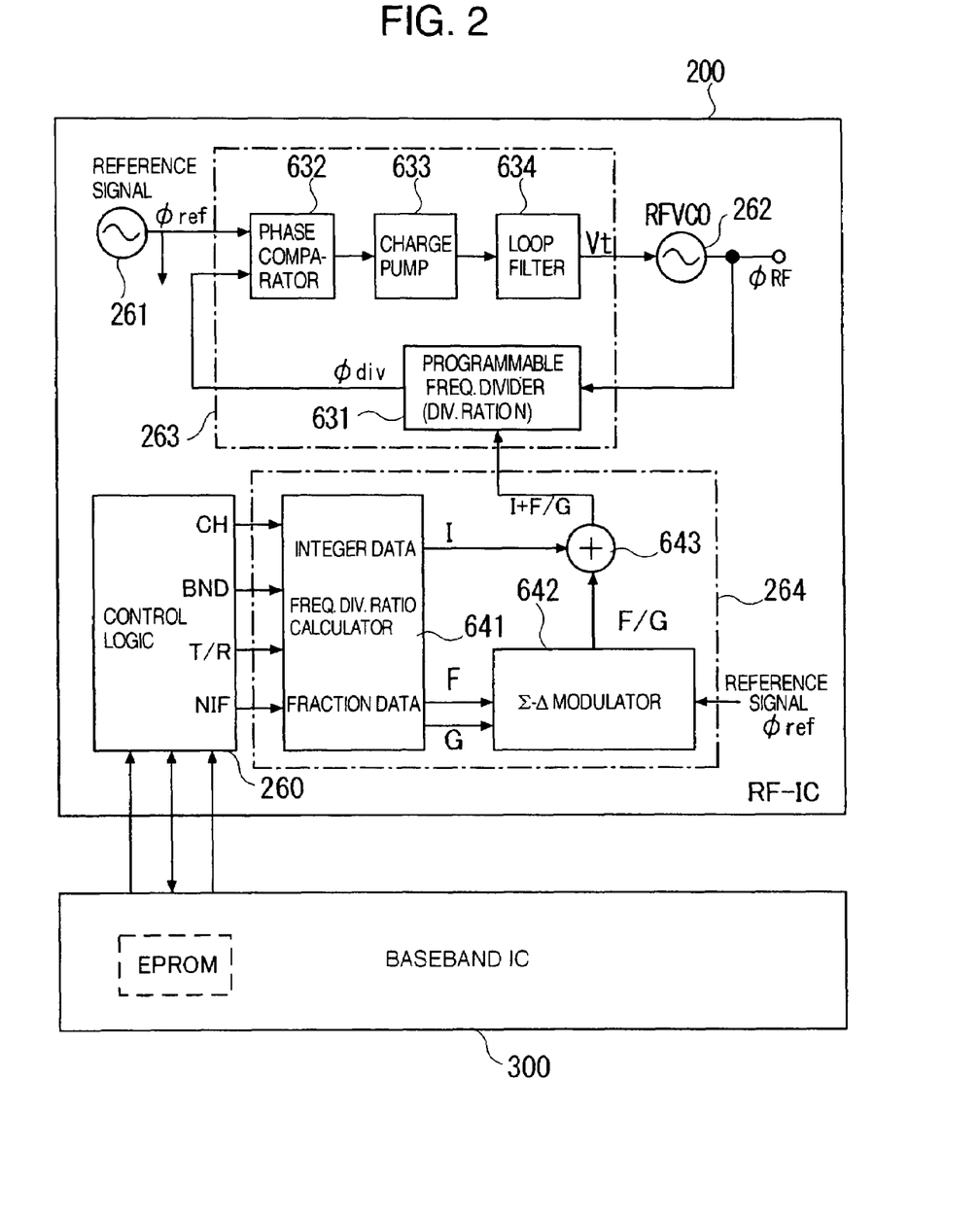
FIG. 2 is a block diagram showing a configuration example of an RF-PLL in the high-frequency IC of the embodiment, in particular, an RF synthesizer and a frequency division ratio generator circuit.

In FIG. 2, there is shown one embodiment of the RF-PLL circuit including the above-noted RF synthesizer 263 and RFVCO 262.

The PLL circuit of this embodiment comprises a programmable frequency divider circuit 631 which frequency-divides the oscillation signal φRF of RFVCO 262, a phase comparator circuit 632 for detection of a phase difference between the reference oscillation signal φref of 26 MHz as generated by the reference signal generator circuit (DCXO) 261 and a signal φdiv that is frequency-divided by the programmable frequency divider circuit 631, a charge pump 633 which determines the use band of TXVCO 11 in accordance with the phase difference thus detected and which generates and outputs a current Id corresponding to the detected phase difference, and a loop filter 634 for generating a voltage corresponding to the detected phase difference to be output from the charge pump 633. The PLL circuit is arranged to oscillate at a frequency pursuant to an oscillation control voltage Vt which is smoothened by the loop filter 634 and fed back to the RXVCO 262. The programmable frequency divider circuit 631 is configurable from more than one counter.

Additionally, for setting up the frequency division ratio of the above-noted programmable frequency divider circuit 631, there is provided in this embodiment a frequency division ratio generation circuit (frequency division ratio setup logic) 264 which calculates for setup the frequency division ratio of programmable frequency divider circuit 631 from externally supplied channel information CH indicative of the setup frequency, band information BND indicating whether the use band is GSM850, GSM900, DCS or PCS, mode information T/R indicating whether a present mode is the send mode or receive mode, and frequency division ratio setting information NIF for setup to the IF frequency divider 231. The frequency division ratio generator circuit 264 is made up of a frequency division ratio calculating unit 641, a sigma-delta modulator 642 with fraction data as its input, and an adder 643. The channel information CH is input from the baseband circuit 300 as a value that is obtained by dividing either the send frequency or the receive frequency by 100 kHz.

In this embodiment, the frequency division ratio NIF of IF frequency divider 231 is set at any one of the values "40", "44", "48" and "52". The reason of this is as follows.

For example, considering a case where the use band is DCS, a present mode is the transmitting mode, and the transmit frequency is 1713.6 MHz, the case of DCS is such that the transmit frequency band falls within a range of from 1710.2 to 1784.8 MHz whereas the receive frequency ranges from 1805.2 to 1879.8 MHz. Additionally, letting the frequency of the oscillation signal φRF of RFVCO 262 be fRF, the frequency of the oscillation signal φTX of send-use VCO 234 be fTX, and the frequency of the intermediate frequency signal φIF at the post stage of IF frequency divider 231 be fIF, the offset PLL is such that fRF'−fTX=fIF; in DCS, fRF'=fRF/2, fRF=fIF×NIF. Due to this, when setting to NIF=44, the frequency fIF of the intermediate frequency signal φIF at the post of IF frequency divider 231 is as follows: fIF=2fTX/(NIF−2)=fTX/21=1713.6 MHz/21=81.6 MHz. Its 22-time harmonic wave and 23-time harmonic wave become 1795.2 MHz and 1876.8 MHz, respectively.

Accordingly in this case, the 22-time harmonic wave causes no problems; however, 1876.8 MHz of 23-time harmonic wave behaves to fall within a range of 1805.2 to 1879.8 MHz of the receive frequency band. This results in the 23-time harmonic wave of the signal φIF passing through the mixer 234 and transmitting VCO 234 and then appearing at the output as a spurious wave. This causes the amount of signal leakage to the receive frequency to become greater, which leads to the risk that the receive band noises no longer satisfy the specifications required. Then, setting the frequency division ratio NIF at "40" results in 20-time and 21-time harmonic waves becoming problematic matter: these become 1803.8 MHz and 1894.0 MHz, respectively. Consequently in this case, the receive frequency band is out of the range of 1805.2 to 1879.8 MHz so that the problem of signal leakage to the receive frequency band is avoided.

The same goes with the case where the send frequency is set at other frequencies. By shifting the frequency division ratio NIF of the IF frequency divider 231, it is possible to avoid the leakage of a signal into the receive frequency band of harmonic wave components of the intermediate frequency signal φIF. This will be referred to hereinafter as the side step of local frequency in the specification. The inventors of the invention as disclosed and claimed herein have found that it is possible, by setting the frequency division ratio NIF of IF frequency divider 231 at a value of "40", "44", "48" or "52", to force the frequency of harmonic wave of intermediate frequency signal φIF to go out of the receive frequency band even where any frequency is set as the send frequency. Based on this discovery, the frequency division ratio NIF is set at a specific value selected from the group consisting of "40", "44", "48", and "52".

Determination of which frequency division ratio is set up from the combination of the plurality of frequency division ratio NIF values "40", "44", "48" and "52" is to be done based on a command coming from the baseband circuit 300 side. Thus it is desirable that at the time of selection of a certain send frequency, high-frequency IC manufacturers or makers prepare in advance a frequency plan indicating which frequency division ratio is good for setup and provide such frequency plan to users, i.e., system designers.

According to this scheme, it becomes possible, by notifying users of the prepared frequency plan which enables the optimum side step, to achieve a system that is less in signal leakage to the receive frequency band, which is faced with the risk of significant variability in characteristics depending on IC layouts.

An explanation will next be given of a method of setting the frequency division ratio N to the programmable frequency divider 631 in the high-frequency IC of the embodiment stated above.

The relationship of the oscillation frequency fRF of RFVCO 262 versus the frequency fRX of a received signal in the receiver circuitry of the high-frequency IC of this embodiment may be given by the following equation, by means of the presence of the frequency divider circuit DVD1 and switch SW/1 and also frequency-division phase shifter circuit 210.

In the case of $$\text{GSM850, GSM900: } fRF = 4 \cdot fRX \quad (1)$$

In the case of $$\text{DCS1800, PCS1900: } fRF = 2 \cdot fRX \quad (2)$$

On the other hand, since the transmitter circuitry is of the offset PLL scheme, the relationship of the oscillation frequency fRF of RFVCO 262 and the frequency fTX of a send signal may be represented by the following equation, while using the frequency division ratio NIF of the IF-use frequency divider 231 which frequency-divides the oscillation signal φRF of RFVCO 262 and generates the intermediate frequency signal φIF used for quadrature modulation.

In the case of GSM850, GSM900: from $$fRF/4-fTX=fRF/NIF,$$

$$fRF=(1/4-1/NIF)^{-1}\cdot fTX \quad (3)$$

In the case of DCS1800, PCS1900: from $$fRF/2-fTX=fRF/NIF,$$

$$fRF=(1/2-1/NIF)^{-1}\cdot fTX \quad (4)$$

In addition, the channel information CH is given by the form which follows.

In the case of GSM850, GSM900:

$$CH=fRX/100 \text{ kHz} \quad (5\text{-}1)$$

$$CH=fTX/100 \text{ kHz} \quad (5\text{-}2)$$

In the case of DCS1800, PCS1900:

$$CH=fRX/200 \text{ kHz}, CH=fTX/200 \text{ kHz} \quad (6\text{-}1)$$

$$CH=fRX/200 \text{ kHz}, CH=fTX/200 \text{ kHz} \quad (6\text{-}2)$$

Therefore, the following relationships are established. First, from the Equations (1) and (5-1), in the case of the signal receive mode of GSM850, GSM900, $$fRF=4\cdot 100 \text{ kHz}\cdot CH=0.4 \text{ MHz}\cdot CH \quad (7)$$

From the Equations (2) and (6-1), in the case of the receive mode of DCS1800, PCS1900, $$fRF=2\cdot 200 \text{ kHz}\cdot CH=0.4 \text{ MHz}\cdot CH \quad (8)$$

From Equations (1) and (5-2), in the case of the send mode of GSM850, GSM900, $$fRF=(1/4-1/NIF)^{31\ 1\cdot}100 \text{ kHz}\cdot CH \quad (9)$$

From Equations (2) and (6-2), in the case of the send mode of DCS1800, PCS1900, $$fRF=(1/2-1/NIF)^{-1}\cdot 200 \text{ kHz}\cdot CH \quad (10)$$

Here, letting the oscillation signal φref of the reference signal generator circuit (DCXO) 261 be set at 26 MHz, the frequency division ratio N of programmable frequency divider 631 may be given by the following equation.

In the case of the receive mode of GSM850, GSM900:

$$N=fRF/26=(0.4/26)\cdot CH=CH/65 \quad (11)$$

In the case of the receive mode of DCS1800, PCS1900:

$$N=fRF/26=(0.4/26)\cdot CH=CH/65 \quad (12)$$

In the case of the send mode of GSM850, GSM900:

$$N=(1/4-1/NIF)^{-1}\cdot CH/65 \quad (13)$$

In the case of the send mode of DCS1800, PCS1900:

$$N=(1/2-1/NIF)^{-1}\cdot CH/65 \quad (14)$$

As apparent from Equations (11) and (12), it can be seen that the denominator of the frequency division ratio N of programmable frequency divider 631 in the receive mode is representable by "65". Additionally in Equations (13)-(14), the frequency division ratio NIF of IF-use frequency divider 231 is such that one is selected by the side step from the combination of values "40", "44", "48" and "52" as has been described previously. Thus it is understandable from Equation (13) that the denominator of the frequency division ratio N of programmable frequency divider 631 at the time of the send mode of GSM850, GSM900 is representable by "585", "650", "715" or "780". It is understandable from Equation (14) that the denominator of the frequency division ratio N of programmable frequency divider 631 at the time of the send mode of DCS1800, PCS1900 may be given as "1235", "1365", "1495" or "1625".

In view of the foregoing, in order to realize by a single circuit the combination of denominator values of the programmable frequency divider 631 in all possible send and receive events, the least common multiple of 65, 585, 650, . . . , 1625 is set as the denominator. However, this results in a significant increase in size of logic circuitry. To avoid this, in this embodiment, an increase in circuit area is suppressed by using several techniques which follow.

(1) The denominator is determined from the band information and the frequency division ratio NIF of the IF frequency divider 231 on a case-by-case basis—say, in a "case-dependent" way.

(2) For the purpose of algorithm commonization, the order of the denominator is consolidated to range from approximately 1200 to 1700 while taking account of the range of 1235 to 1755 at the time of the send mode of DCS1800, PCS1900.

(3) Any possible errors of the frequency division ratio occurring due to the alignment of the order of the denominator in the above-noted way is adjustable by adequately modifying the numerator.

Figure 3:
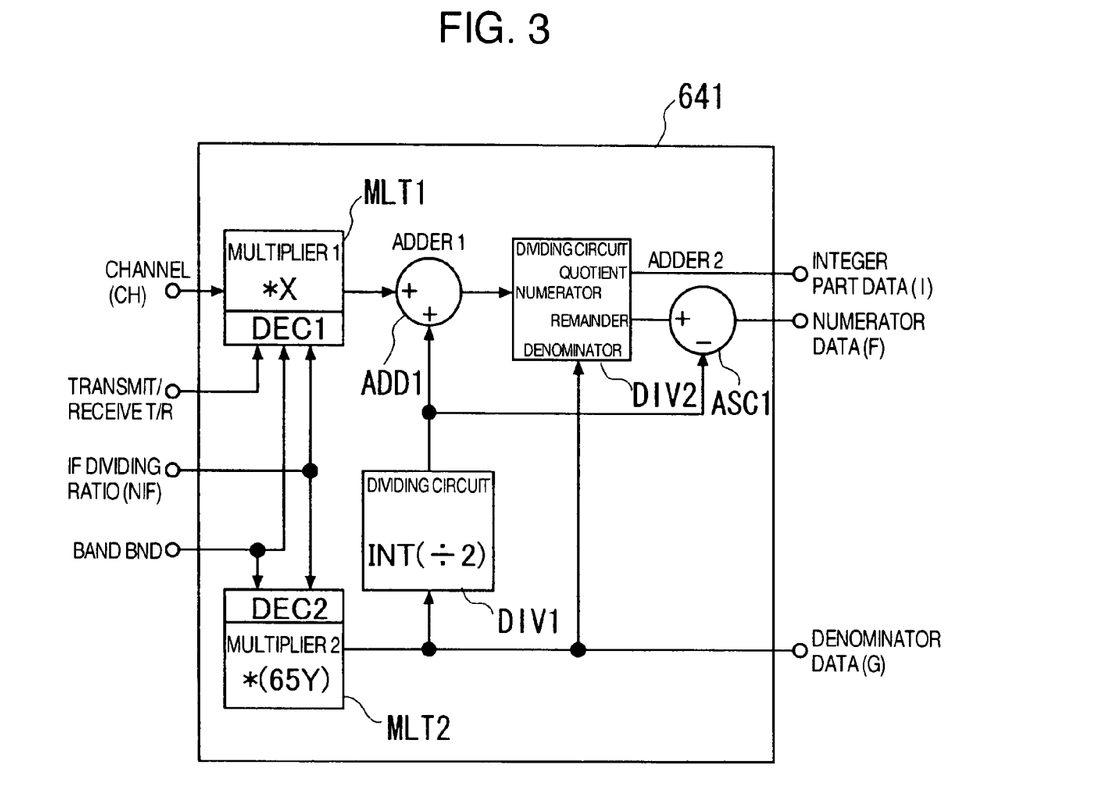
FIG. 3 is a block diagram showing a configuration example of a frequency division ratio calculator unit making up the frequency division ratio generator circuit of FIG. 2.

FIG. 3 shows an exemplary configuration of the frequency division ratio calculation unit 641. The frequency division ratio calculator unit 641 is generally configured from a multiplier MLT1 which obtains a value with X multiplied to the channel information CH, a multiplier MLT2 which multiplies a specified constant (65 times) to a value determined from the band information BND and frequency division ratio information NIF, a dividing circuit DIV1 which reduces an output of the multiplier MLT1 to 1/2 and then outputs its integer part, an adder ADD1 which adds together an output of multiplier MLT1 and the integer part as output from the dividing circuit DIV1, a dividing circuit DIV2 which divides an output of adder ADD1 by an output of multiplier MLT2 and outputs a "quotient" and "remainder," and a subtracter ASC1 which subtracts an output of dividing circuit DIV1 from the "remainder" being output from the dividing circuit DIV2. The value of the "quotient" as output from the dividing circuit DIV2 is supplied as integer part data I to the programmable frequency divider 631, the value being output from the subtracter ASC1 is supplied thereto as numerator data F, and the output of multiplier MLT2 is supplied thereto as denominator data G, respectively. In this specification, "F/G" consisting of the numerator data F and denominator data G will be called the fraction part data.

Decoders DEC1, DEC2 are provided in the multiplier MLT1 and multiplier MLT2, respectively. The decoder DEC1 decodes the information T/R indicating whether a present session is signal transmission or reception and the band information BND and also the frequency division ratio information NIF to thereby output the value X for multiplication to the input channel information CH at the multiplier MLT1. The decoder DEC2 decodes the band information BND and frequency division ratio information NIF and outputs the value Y for constant-time (65 times) multiplication at the multiplier MLT2. See FIG. 4, which shows the relationship of an input versus an output of the decoder DEC1. FIG. 5 shows an input-to-output relationship of the decoder DEC2.

Figure 4:
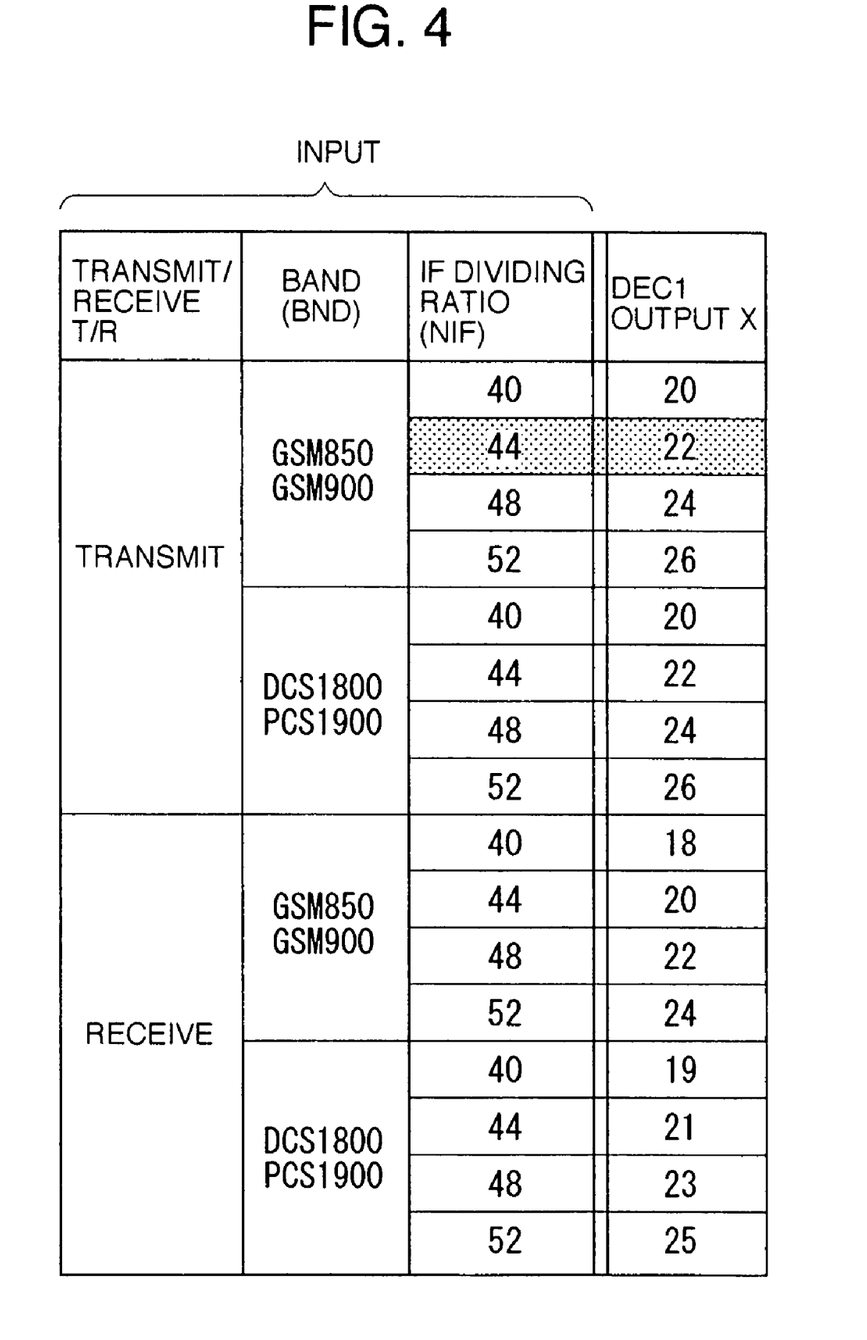
FIG. 4 is a diagram for explanation of the relationship of an input and an output of a decoder operatively associated with a multiplier MLT1 making up the frequency division ratio calculator unit of FIG. 3.
Figure 5:
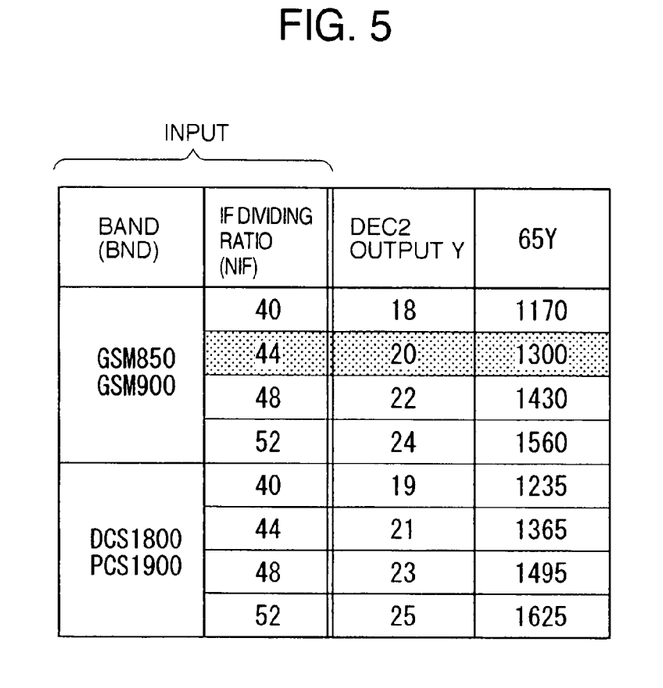
FIG. 5 is an explanation diagram showing the relationship of an input and an output of a decoder associated with a multiplier MLT2 making up the frequency division ratio calculator unit of FIG. 3.

It is apparent from viewing FIGS. 4 and 5 that in case a present mode is the send mode of GSM with the frequency division ratio NIF being set at "44" by way of example, the X value of the multiplier MLT1 is "22" whereas Y of multiplier MLT2 is "20". Whereby, in the case of the channel information CH being set at "8274" (the send frequency is at 827.4

MHz), the multiplier MLT1's output CH×22 measures "182028" while the denominator data G which is the output of multiplier MLT2 becomes "1300" so that the output of dividing circuit DIV1 is "650", the output of adder ADD1 is "182678," the integer part data I being output from the dividing circuit DIV2 is "140", and the numerator data F as output from the subtracter ASC1 becomes "28".

Note here that the adder ADD1 and subtracter ASC1 are provided to perform the offset processing, not for letting the fraction part data fall within the range of 0 to 1299 but for letting it range from −650 to +649. The reason of this is as follows: letting the resultant average value be in close proximity to ±0 rather than 650 makes it possible to lessen DC components.

Next, an explanation will be given of a more detailed configuration of the sigma-delta modulator 642 in the frequency division ratio generator circuit 264 of the embodiment stated supra along with a method for generating the frequency division ratio N.

Figure 6:
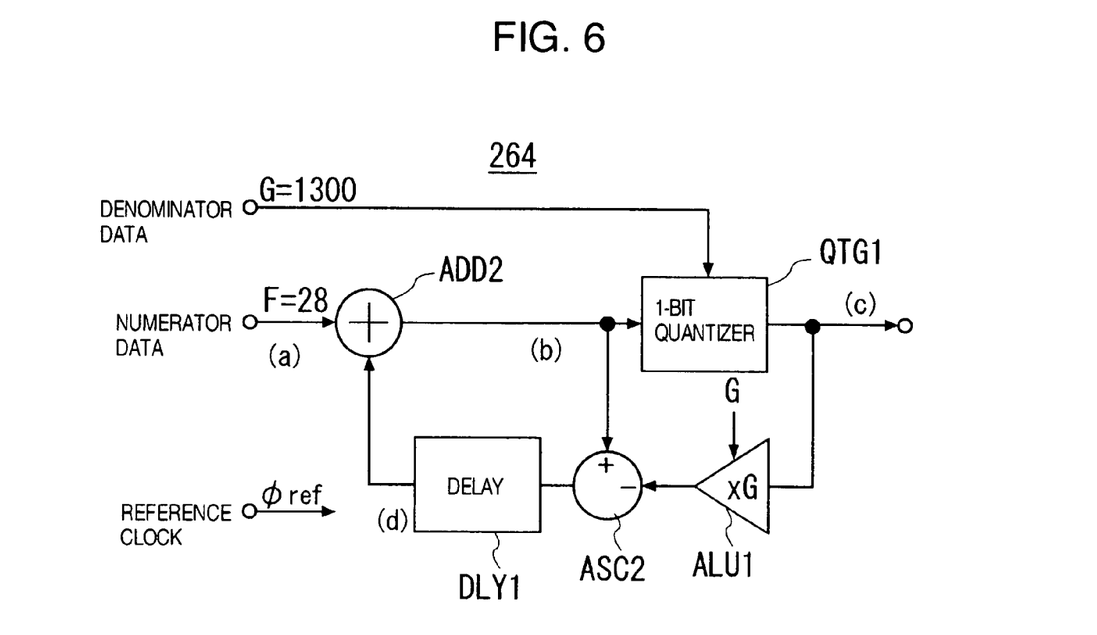
FIG. 6 is a block diagram showing an exemplary configuration of a sigma-delta modulator making up the frequency division ratio generator circuit of FIG. 2.

As shown in FIG. 6, the sigma-delta modulator 642 of this embodiment is made up of an adder ADD2 which adds input numerator data F and feedback data together, a 1-bit quantizer QTG1 for quantization of an addition result, an arithmetic computing unit ALU1 for increasing an output of the quantizer QTG1 by factor of a constant number (constant-number multiplication), a subtracter ASC2 which obtains a difference between an output of the arithmetic unit ALU1 and an output of the adder ADD2, and a delay unit DLY1 which delays the resultant difference for feedback to the adder ADD2. The sigma-delta modulator operates in synchronization with the reference clock signal $\phi$ref to convert the input numerator data into data in the time axis direction and then output the data.

The quantizer QTG1 and arithmetic unit ALU1 are supplied with denominator data G from the frequency division ratio calculator unit 641. The quantizer QTG1 outputs "+1" when the input is greater than the denominator data G, outputs "0" when the input falls within a range of 0 to G, and outputs "−1" when the input is less than 0. On the other hand, the arithmetic unit ALU1 is such that its gain (multiple number) is set at the same value as the denominator data G as given by the frequency division ratio calculator unit 641. This unit increases the input by a factor of G and then outputs it. Although the arithmetic unit ALU1 may be a multiplier, it is also possible to configure it by a register for setup of G and a selector or the like which is responsive to an input for selecting for output an appropriate one of a present value of the register or its sign-inverted value or "0".

Here, an operation of the sigma-delta modulator 642 in case the numerator data F as input from the frequency division ratio calculator unit 641 is "28" and the denominator data G is "1300" will be explained with reference to FIG. 7.

Figure 7:
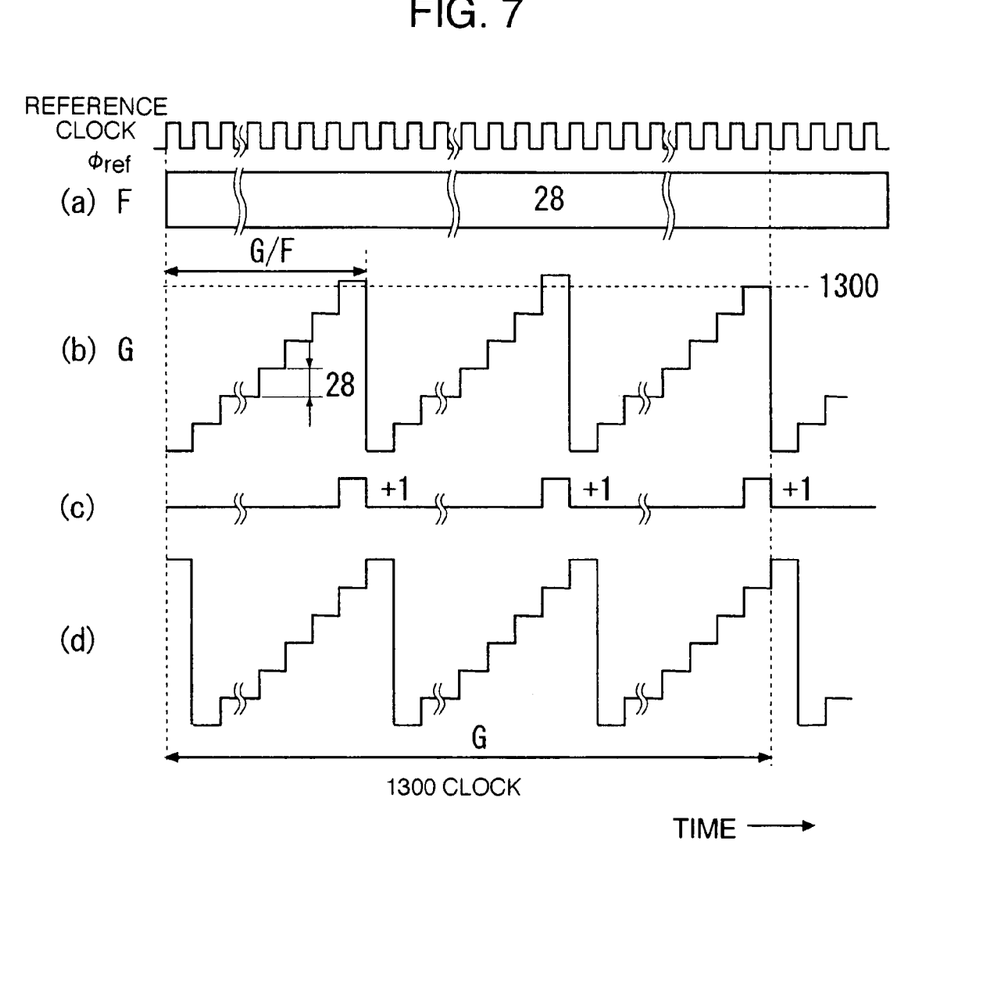
FIG. 7 is a timing chart showing operation timings of the sigma-delta modulator of FIG. 6.

When the numerator data F is "28," the output of adder ADD2 increases in a stair step-like pattern with every increment of "28" on a per-clock basis as shown in (b) of FIG. 7. As the quantizer QTG1 outputs "+1" when the input is greater than the denominator data G, it outputs "+1" when the output of adder ADD2 goes beyond G (=1300). More specifically, it outputs "+1" per group of 1300/28 (nearly equal to 47) clocks. As a result, the sigma-delta modulator 642 is expected to output "+1" for 28 times with respect to 1300 reference clocks $\phi$ref.

Thus it can be seen that the sigma-delta modulator 642 of this embodiment outputs a specific number of "+1"s, which number is equal to the number of the fraction data F during a time period of the clock number of denominator data G. This is obvious by also taking into consideration the fact that when dividing the time period G of reference clocks $\phi$ref by a value G/F which is obtained by dividing G that is the threshold value of quantizer QTG1 by a change amount F of the input, the result is G÷G/F=F.

Figure 8:
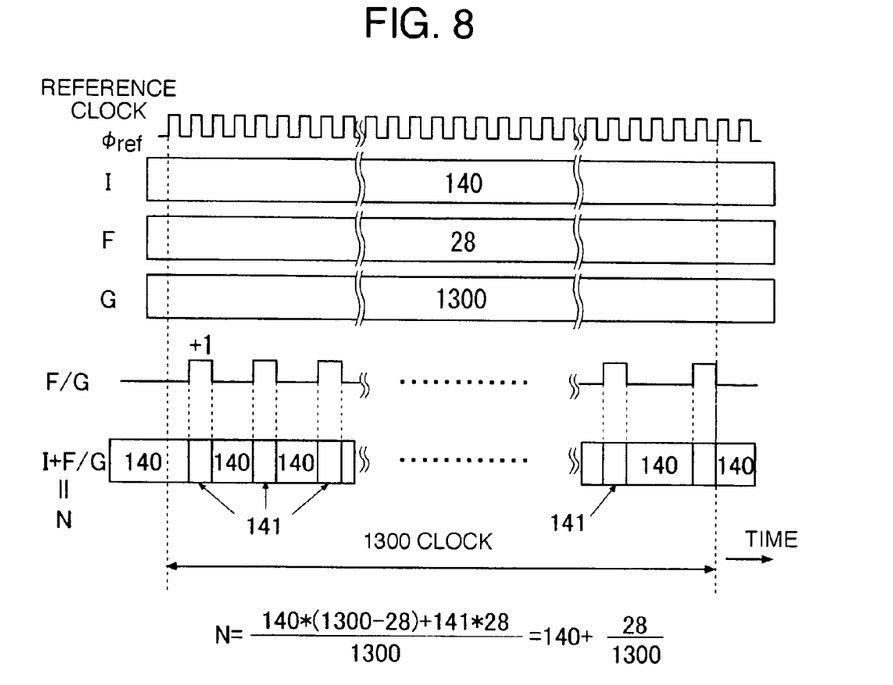
FIG. 8 is a timing chart showing operation timings of the frequency division ratio generator circuit of FIG. 2.

FIG. 8 shows the relationship of the integral data I and numerator data F plus denominator data G as output from the frequency division ratio calculator unit 641 in the frequency division ratio generator circuit 264, the fraction part data F/G as output from the sigma-delta modulator 642, and the output frequency division ratio N (=I+F/G) of the adder 643 which adds together the integral part data I and fraction part data F/G and outputs resultant frequency division ratio to the programmable frequency divider 631. As shown in FIG. 8, in the case of I=140, F=28 and G=1300, "141" is output to the programmable frequency divider 631 for 28 times during generation of 1300 reference clocks $\phi$ref; for the remaining 1272 times, "140" is output. More specifically, "141" is supplied as the frequency division ratio N from the frequency division ratio generator circuit 264 to programmable frequency divider 631 only at 28 time points during generation of 1300 reference clocks $\phi$ref; for the remaining 1272 times within the 1300 times, "140" is alternatively supplied as the frequency division ratio N from the frequency division ratio generator circuit 264 to programmable frequency divider 631. In accordance with this frequency division ratio N thus supplied, the programmable frequency divider circuit 631 frequency-divides the oscillation signal $\phi$RF to thereby form a signal $\phi$div. It can be considered that the signal $\phi$div thus formed thereby is substantially the same as a signal which is formed by the programmable frequency divider circuit 631 through frequency division of the oscillation signal $\phi$RF by a frequency division ratio (140+28/1300) of less than the decimal point, when looking at a given time period.

Incidentally, in the one-order or first-degree sigma-delta modulator of the embodiment of FIG. 6, there exits in the modulated frequency division ratio a periodical repetition or iteration that is, a fixed pattern of prespecified frequency such as in the manner that "141" is regularly output for 28 times with respect to 1300 times, by way of example. Although this periodical fixed pattern is at relatively low frequency, this is not desirable because it appears as a spurious component in the output of the RF-PLL which includes the programmable frequency divider 231.

Consequentially, in order to enable execution of noise shaping by removal of such periodic fixed pattern being included in this first-order sigma-delta modulator, it has been found that it is desirable to make use of a higher order of sigma-delta modulator as will be described below. Note here that a third-order or "cubic" sigma-delta modulator is used in view of the fact that the use of an extra-high order of modulator as the high-order sigma-delta modulator would result in a decrease in the noise shaping effect and also in an excessive increase in circuit scale.

Figure 9:
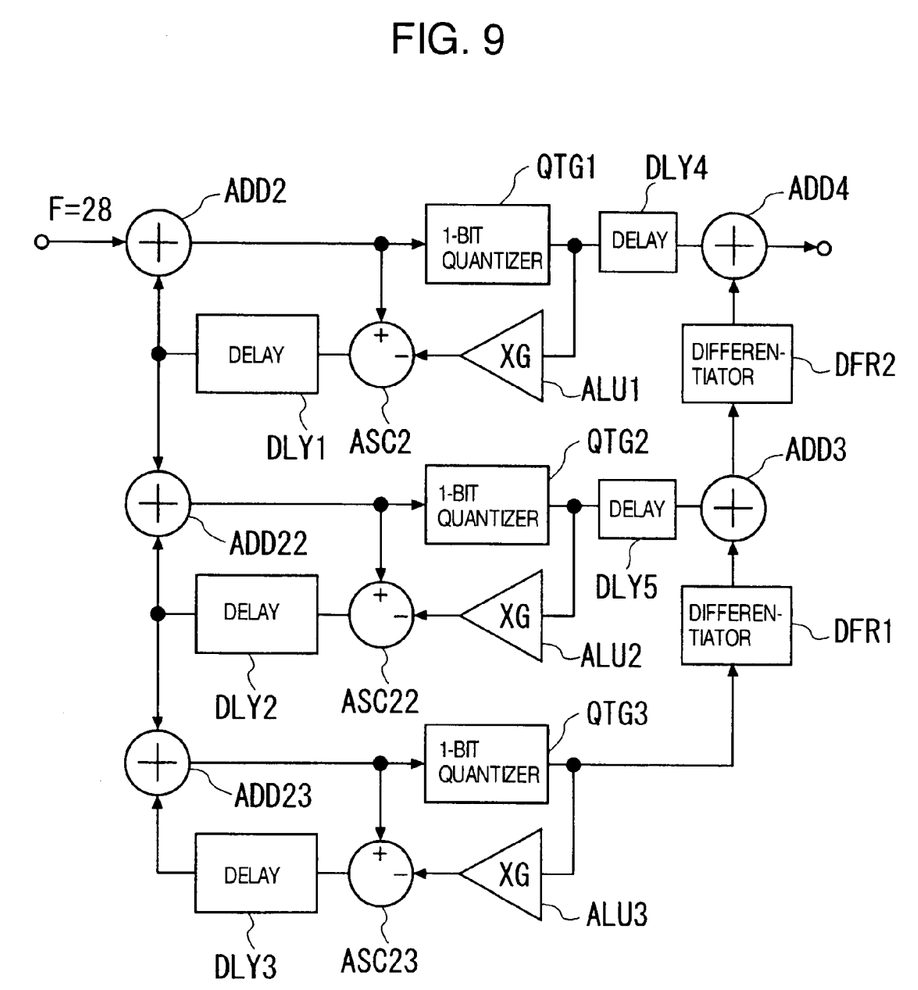
FIG. 9 is a block diagram showing a configuration example of a three-order sigma-delta modulator for use in a second embodiment of this invention.

FIG. 9 shows an exemplary configuration of a third-order sigma-delta modulator for use in a second embodiment of the invention.

The sigma-delta modulator of this embodiment comprises three sets of circuit modules each equivalent in configuration to an ensemble of components making up the first-order sigma-delta modulator of FIG. 1 namely, the adder ADD2, 1-bit quantizer QTG1, arithmetic unit ALU1, subtracter ASC2 and delay unit DLY1, and is arranged in a way which follows: an output of the delay DLY1 at the first stage is input, in place of F, to a second stage of adder ADD22; an output of the second-stage delay DLY2 is input in place of F to a third stage of adder ADD23; a value obtained by differentiation of an output of a third stage of 1-bit quantizer QTG3 by a differentiator DFR1 and an output of a second stage of 1-bit quantizer QTG2 are added together by an adder ADD3; and, a value obtained by differentiation of such addition value at a differentiator DFR2 and an output of the first-stage 1-bit quantizer QTG1 are added together by an adder ADD4 and then output. Additionally, delay devices DLY4 and DLY5 are provided for equalization of delay amounts at the first, second and third stages.

Using the third-order sigma-delta modulator makes invisible the fixed pattern of low frequency components as contained in the fraction part data F/G, thereby permitting output of the one with diffusion toward higher frequencies. More practically, consider the case of I=140, F=28 and G=1300 for example. In this case, "141" is output to the programmable frequency divider circuit 631 for 28 times during generation of 1300 reference clocks φref; in addition thereto, "142" and "143" or the like are output along the way of them while at the same time allowing "138" to be output for the same number of times as the appearance times of "142" in such a way as to cancel out them and also letting "137" be output for the same number of times as the appearance times of "143." In short, an averaged result becomes identical to output of "141" for 28 times.

Whereby, in the case of using the third-order sigma-delta modulator also, the frequency division ratio N which is the same as that in the case of using the first-order sigma-delta modulator is given to the programmable frequency divider circuit 631 to thereby reduce occurrence of spurious ones which "ride" from the output of sigma-delta modulator onto the output of RF-PLL, resulting in the intended noise-shaping effect being obtained. It should be noted that the operation of outputting "142" and "143" and also "138" and "137" for canceling out them may be replaced with an operation of outputting "141" for more than N (N≧29) times during generation of 1300 reference clocks φref while outputting "139" for (N−28) times on the average, letting "141" be output only for 28 times during generation of 1300 reference clocks φref.

Figure 10:
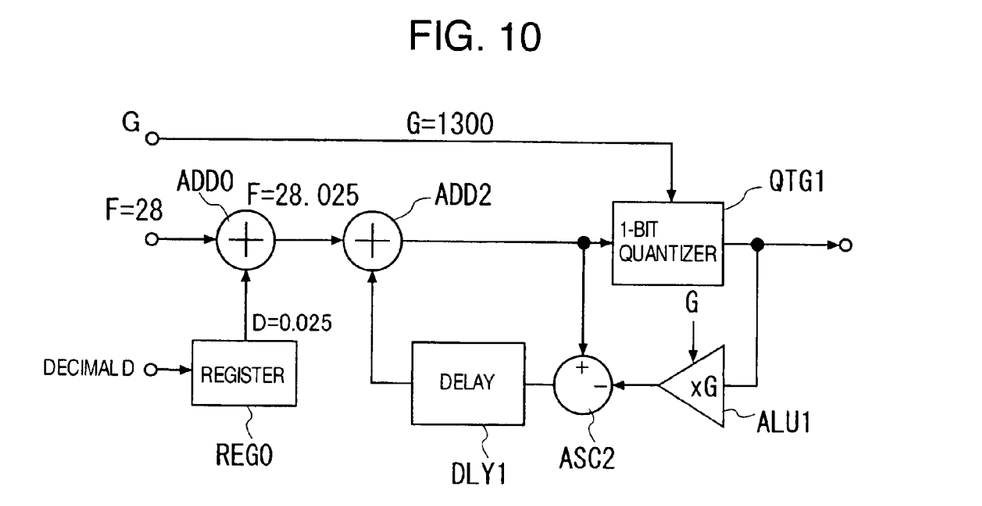
FIG. 10 is a block diagram showing an exemplary configuration of a sigma-delta modulator for use in a third embodiment of the invention.

An explanation will next be given of a third embodiment of the invention with reference to FIG. 10. This embodiment is the one that enables adjustment of the oscillation frequency of RF-PLL by adding a register REG0 and an adder ADD0 to the front or "pre" stage of the sigma-delta modulator 642 of the embodiment of FIG. 6. To be more precise, this is the one that makes the decimal part data of the frequency division ratio expandable toward the decimal direction by enabling setup of the data D of decimal part at the register REG0 and also by causing the adder ADD0 to add together the numerator data F and decimal data D for supplement to the adder ADD2. With such an arrangement, in cases where "28" is set up as the numerator data F and "0.025" is set as the decimal data D for example, the sigma-delta modulator 642 operates to output "+1" for 28025 times with respect to 1300000 times, whereby it becomes possible to achieve precise adjustment (fine tuning) of the oscillation frequency of RF-PLL.

Currently available mobile telephone are faced with the phenomenon that the power supply voltage decreases at the time of transmission that uses a power amplifier with large power consumption when compared to the event of signal reception that uses no power amplifiers. This phenomenon is occurrable obviously in the case of using a battery voltage as the power supply voltage and also in the case of using a DC-DC converted voltage. Due to this, the power supply voltage differs in potential between signal send and receive events, resulting in occurrence of little deviation in frequency of the reference oscillator circuit (VCXO) 261 which generates the reference oscillation signal φref. Nevertheless, by applying this embodiment and setting the decimal data D at the register REG0, it becomes possible to avoid such frequency deviation.

It is noted that the decimal data D to be set in the register REG0 may be arranged to determine by pre-measurement of the oscillation frequency of the reference oscillator circuit at the time of letting the power supply voltage vary in potential, and be stored in a rewritable nonvolatile memory such as an EPROM or flash memory or else within the baseband circuit 300, send the decimal data D also when giving the band information BND and the frequency division ratio information NIF from the baseband circuit 300 to high-frequency IC 200, and then set it in the register REG0. Another arrangement is that a multiplier is provided in place of the adder ADD0 while setting in the register REG0 a value such as for example 1.001 to thereby let the decimal data F become a value which includes a portion of less than the decimal point.

Although the present invention made by the inventors is explained based on some embodiments thereof, the invention should not be limited thereto. For example, in the embodiments stated supra, the one was explained which provides within the high-frequency IC the decoder DEC1, DEC2 for generating a certain value to be multiplied to an input at the multiplier MLT1, MLT2 being provided in the frequency division ratio generator circuit; however, it may alternatively be arranged to give a value (see FIG. 4 and FIG. 5) equivalent to the output of decoder from the baseband circuit 300 to the high-frequency IC, rather than providing the decoder DEC1, DEC2.

In addition, although in the above-stated embodiments the frequency division ratio NIF of IF-use frequency divider 231 is given from the baseband circuit 300 external to the chip, if the spurious remedy is not taken into consideration, then it may be arranged so that the information T/R indicating whether the send or receive session and the band information BND plus the channel information CH are used to automatically determine the frequency division ratio NIF within the chip for setup in the IF frequency divider 231.

Further note that although in the embodiments stated above are directed to the high-frequency IC with its transmitter circuitry and receiver circuitry formed together on the same semiconductor chip, it is also possible to apply to the one that has built-in transmitter circuitry and RF-PLL and is operable to supply an oscillation signal as generated by the RF-PLL to receiver circuitry that is formed on a separate semiconductor chip. Additionally, although there was stated previously the specific one which is arranged so that the oscillator circuit (VCXO) 261 for generation of the signal φref for the reference use is formed on the same semiconductor chip along with the transmitter circuitry and receiver circuitry, it may be modified so that the reference signal φref is given from outside of the chip.

While in the above description the explanation was made while mainly relating to certain one which applies this invention made by the present inventors to frequency divider circuitry making up the RF-PLL in high-frequency ICs in the technical field if utilization that becomes the background of the invention, the invention is not exclusively limited thereto, and it is possible to apply the invention to any types of programmable frequency dividers as designed to perform frequency division at frequency division ratios consisting essentially of the so-called the integer part and decimal part. Additionally while in the above embodiments the explanation is made concerning the case of application to high-frequency ICs for use in wireless communications systems such as mobile phones, this invention is not limited thereto and may also be applicable to high-frequency ICs having PLL circuitry for generating a high-frequency signal which is combined together with a receive signal and a send signal for achievement of frequency conversion and modulation/demodulation operations required.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor integrated circuit device for wireless communication, comprising:
   a reference oscillation circuit which generates an oscillation signal in accordance with a set value from outside of the semiconductor integrated circuit device;
   an intermediate frequency division circuit which generates an intermediate frequency signal by dividing the oscillation signal;
   a frequency-division phase-shift circuit which performs frequency-dividing the intermediate frequency signal and generates orthogonal or quadrature signals with their phase being shifted by 90 degrees from each other;
   a modulator circuit which receives transmission signals from outside of the semiconductor integrated circuit device and the quadrature signals and outputs modulated signals;
   an adder circuit which synthesizes the modulated signals; and
   a transmission oscillation circuit which includes a phase detector, a loop filter, a transmission oscillator, a coupler and a mixer and which receives an output of the adder circuit and the oscillation signal and generates a transmission signal;
   wherein the reference oscillation circuit includes a reference oscillator which generates a reference oscillation signal, a programmable frequency divider which performs frequency-dividing the oscillation signal in accordance with a frequency division ratio supplied thereto, a phase comparator which detects a phase difference between an output signal of the programmable frequency divider and the reference oscillation signal, a charge pump and a filter which generate a voltage or a current based on the phase difference detected by the phase comparator, and a high frequency oscillator which generates the oscillation signal and which is controlled by the charge pump and the filter,
   wherein the semiconductor integrated circuit device further comprises a frequency division ratio generation circuit which generates an integer part I and a fraction part F/G based on band information concerning an externally supplied use frequency band and mode information indicative of whether signal transmission or reception and channel information as to a setup frequency, and for generating the frequency division ratio based on said integer part I and fraction part F/G, and
   wherein the frequency division ratio generation circuit is arranged to generate the frequency division ratio of the programmable frequency divider based on the band information, the mode information, the channel information, and externally supplied setup information as to the frequency division ratio of the programmable frequency divider.

2. A semiconductor integrated circuit device according to claim 1, further comprising:
   low noise amplifiers which amplify reception signals in respective frequencies of the reception signals;
   a reception frequency-division phase-shift circuit which performs frequency-dividing the oscillation signal and generates orthogonal or quadrature signals with their phases being shifted by 90 degrees from each other; and
   reception mixers which synthesize outputs of the low noise amplifiers and an output of the reception frequency-division phase-shift circuit.

3. A semiconductor integrated circuit device according to claim 1, wherein the denominator G of said fraction part F/G is arranged to be generated based on any integer as selected from a combination of a plurality of integers prepared in advance in a way corresponding to said band information and said setup information as to the frequency division ratio.

4. A semiconductor integrated circuit device according to claim 3, wherein a value for obtaining the numerator F of said fraction part F/G is arranged to be generated based on any integer as selected from a combination of a plurality of integers prepared in advance in a way corresponding to said band information and said mode information plus said channel information and also based on said setup information as to the frequency division ratio.

5. A semiconductor integrated circuit device according to claim 4, wherein said frequency division ratio generation circuit comprises:
   a frequency division ratio calculation circuit for outputting as the integer part I a quotient obtained by dividing said value generated based on any integer as selected from the combination of the plurality of integers prepared in advance in a way corresponding to said band information and said mode information plus said channel information and also said setup information as to the frequency division ratio by the denominator G generated based on said any integer thus selected while outputting a remainder as the numerator F; and
   a delta-sigma modulation circuit for using said denominator G and for performing delta-sigma modulation of said numerator F by using said numerator F to thereby generate the fraction part F/G, wherein
   the integer part I generated by said frequency division ratio calculation circuit and the fraction part F/G generated by said delta-sigma modulation circuit are combined together and supplied as a frequency division ratio to said programmable frequency divider.

6. A semiconductor integrated circuit device according to claim 5, wherein said delta-sigma modulation circuit includes an adder for adding said numerator F for use as input data and feedback data together, a one-bit quantizer for quantization of an addition result, an arithmetic unit for increasing an output of the quantizer by a factor of a constant number, a subtracter for obtaining a difference between an output of the arithmetic unit and an output of the adder, and delay means for delaying the resultant difference for feedback to said adder.

7. A semiconductor integrated circuit device according to claim 6, wherein said delta-sigma modulation circuit is a delta-sigma modulation circuit of more than two orders.

8. A semiconductor integrated circuit device according to claim 7, wherein the denominator G of said fraction part F/G is an integral multiple of "65" and is set to fall within a range of from 1200 to 1700.

9. A semiconductor integrated circuit according to claim 8, wherein said intermediate frequency division circuit is arranged so that the frequency division ratio thereof is externally supplied after selection of a certain one from among a plurality of values prepared in advance, said certain one being appropriate for preventing harmonic wave components of the intermediate frequency signal as frequency-divided by said intermediate frequency division circuit from entering a signal reception frequency band.

10. A semiconductor integrated circuit device according to claim 9, wherein a register capable of externally setting a value which gives decimal number data of the numerator F of said fraction part F/G to be output from said frequency division ratio generation circuit and an arithmetic unit for computing the value being set in the register and said numerator F are provided in correspondence to said delta-sigma modulation circuit.

11. A semiconductor integrated circuit device according to claim 1, wherein the phase detector, loop filter, transmission oscillator, and mixer constitute a PLL circuit, wherein the mixer is arranged to mix together a feedback signal that is extracted by the coupler from the transmission signal and a signal that is obtained by frequency division of the oscillation signal generated by the reference oscillation circuit, to thereby generate a frequency-divided oscillation signal that is input to the phase detector for comparison with the output of the adder circuit.

12. A semiconductor integrated circuit device according to claim 2, further comprising amplifier units arranged to receive and amplify respective outputs of the reception mixers and to output the amplified signals as received I and Q signals.

* * * * *